United States Patent
Yang et al.

(10) Patent No.: US 10,432,186 B2
(45) Date of Patent: Oct. 1, 2019

(54) VARIABLE RESISTANCE POWER SWITCH FEEDBACK

(71) Applicant: Ford Global Technologies, LLC, Dearborn, MI (US)

(72) Inventors: Shuitao Yang, Beaumont, TX (US); Yan Zhou, Canton, MI (US); Lihua Chen, Farmington Hills, MI (US); Fan Xu, Novi, MI (US); Mohammed Khorshed Alam, Canton, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 4 days.

(21) Appl. No.: 15/812,175

(22) Filed: Nov. 14, 2017

(65) Prior Publication Data

US 2019/0149145 A1  May 16, 2019

(51) Int. Cl.
| | | |
|---|---|---|
| *H03K 3/012* | (2006.01) | |
| *H03K 17/082* | (2006.01) | |
| *H02M 7/5395* | (2006.01) | |
| *H02P 27/08* | (2006.01) | |
| *B60K 6/22* | (2007.10) | |
| *B60R 16/00* | (2006.01) | |

(52) U.S. Cl.
CPC ......... *H03K 17/0828* (2013.01); *B60K 6/22* (2013.01); *B60R 16/005* (2013.01); *H02M 7/5395* (2013.01); *H02P 27/08* (2013.01); *B60Y 2200/92* (2013.01); *B60Y 2400/61* (2013.01); *Y10S 903/904* (2013.01)

(58) Field of Classification Search
CPC ...................................................... H03K 3/012
See application file for complete search history.

(56) References Cited

U.S. PATENT DOCUMENTS

| | | | | |
|---|---|---|---|---|
| 5,396,117 | A * | 3/1995 | Housen | .............. H03K 17/0826 327/434 |
| 6,633,473 | B1 * | 10/2003 | Tomomatsu | ........ H01L 29/7395 257/E29.198 |
| 8,004,806 | B2 | 8/2011 | Li | |
| 8,743,523 | B2 | 6/2014 | Acharya et al. | |
| 9,322,852 | B2 * | 4/2016 | Chen | ...................... H03K 17/18 |
| 2018/0205372 | A1 * | 7/2018 | Sasaki | ................ H03K 17/0828 |

FOREIGN PATENT DOCUMENTS

CN  103036469 A  4/2013

* cited by examiner

*Primary Examiner* — Hai L Nguyen
(74) *Attorney, Agent, or Firm* — David B. Kelley; Brooks Kushman P.C.

(57) ABSTRACT

A vehicle powertrain has a power inverter that includes a load switch with a main emitter and a current mirror emitter, a variable resistor coupled between the current mirror emitter and the main emitter, and a controller. The controller may be configured to adjust a gate voltage based on a voltage across the variable resistor, and responsive to the gate voltage exceeding a Miller plateau gate voltage, increase a variable resistor resistance such that feedback increases as the load switch saturates.

18 Claims, 5 Drawing Sheets

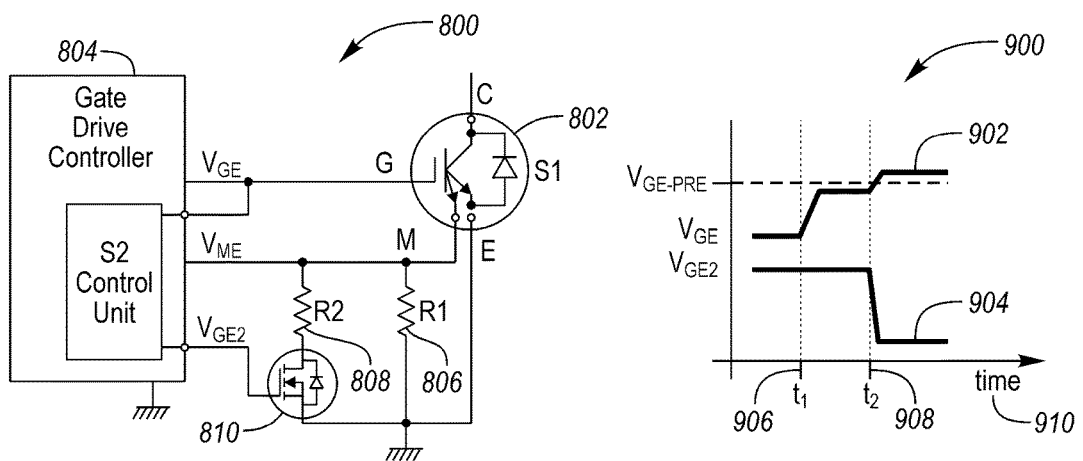
FIG. 8  FIG. 9
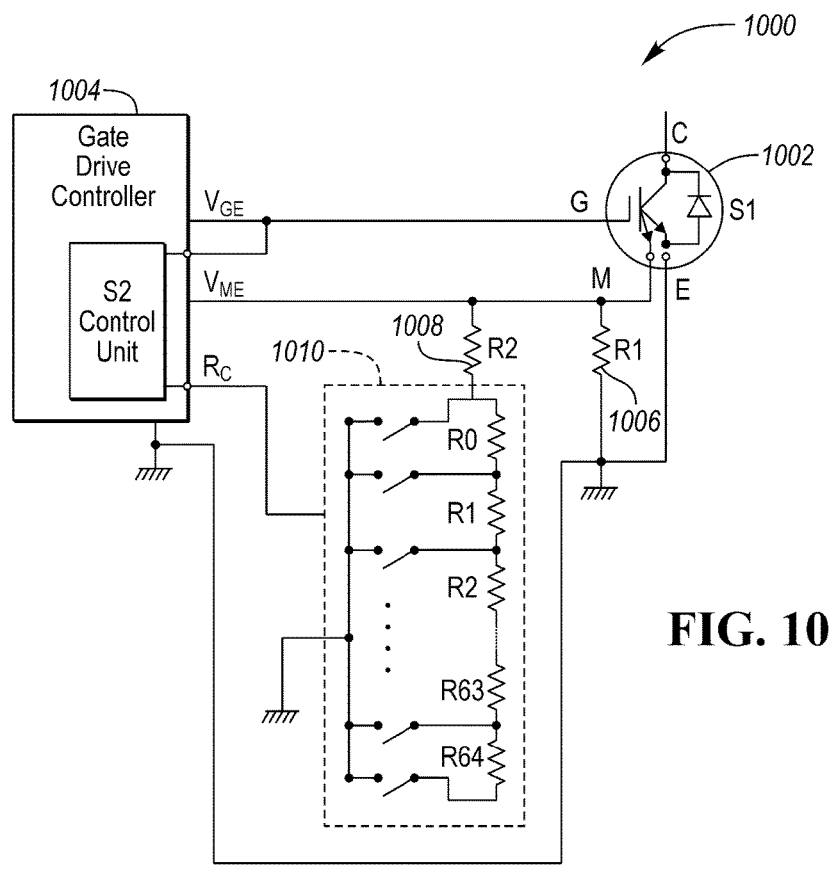
FIG. 10

VARIABLE RESISTANCE POWER SWITCH FEEDBACK

TECHNICAL FIELD

This application is generally related to a gate driver for a solid-state switch of a vehicular power module in which a variable resistance is coupled between a mirror switch emitter and a load switch emitter.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a maximum current. During vehicular operation, the high-voltage components in the electric vehicle powertrain may be subject to stresses including over current or short current conditions.

Also, many electrified vehicles include a DC-DC converter, also referred to as a variable voltage converter (VVC), to convert the voltage of the traction battery to an operational voltage level of the electric machine. The electric machine, which may include a traction motor, may require a high voltage and high current. Due to the voltage, current and switching requirements, a solid-state switch such as an Insulated Gate Bipolar Junction Transistor (IGBT) is typically used to generate the signals in the power inverter and the VVC. Similarly, components of the DC-DC converter may be subject to stresses including over current or short current conditions.

SUMMARY

A vehicle powertrain has a power inverter that includes a load switch with a main emitter and a current mirror emitter, a variable resistor coupled between the current mirror emitter and the main emitter, and a controller. The controller may be configured to adjust a gate voltage based on a voltage across the variable resistor, and responsive to the gate voltage exceeding a Miller plateau gate voltage, increase a variable resistor resistance such that feedback increases as the load switch saturates.

A vehicle powertrain includes a load switch monolithically integrated with a mirror switch, a variable resistor coupled between a mirror switch emitter and a reference point, and a controller. The controller may be configured to adjust a gate voltage based on a voltage across the variable resistor, and responsive to the gate voltage exceeding a Miller plateau gate voltage, increase a variable resistor resistance such that feedback increases as the load switch saturates.

A method of controlling a power switch in a vehicle powertrain includes setting a resistance of a variable resistor, applying a charge to the gate to increase the gate voltage, and in response to the gate voltage exceeding a Miller plateau gate voltage, changing the resistance of the variable resistor. The variable resistor may be coupled between a current mirror emitter and a reference point, to a first value while a gate voltage of the power switch is below a turn-on threshold.

BRIEF DESCRIPTION OF THE DRAWINGS

FIG. 8 is a schematic diagram of a gate driver for a power switch with a current mirror and a selectable resistance feedback circuit.

FIG. 9 is a graphical illustration of characteristics of the power switch with a current mirror of FIG. 6 with respect to time.

FIG. 10 is a schematic diagram of a gate driver for a power switch with a current mirror and a selectable resistance feedback circuit.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Generally, solid-state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods may be applicable to other SSDs, for example, an insulated gate SSD includes both an IGBT and a MOSFET. Operation of an IGBT is controlled by a gate voltage supplied by a gate driver.

Here, an IGBT current mirror feedback system and method is disclosed that may be implemented for use during power device turn-on. The main principle is that a variable resistance resistor is coupled with an IGBT's current mirror sense pin to adjust the feedback as the device turns on.

Figure 1:
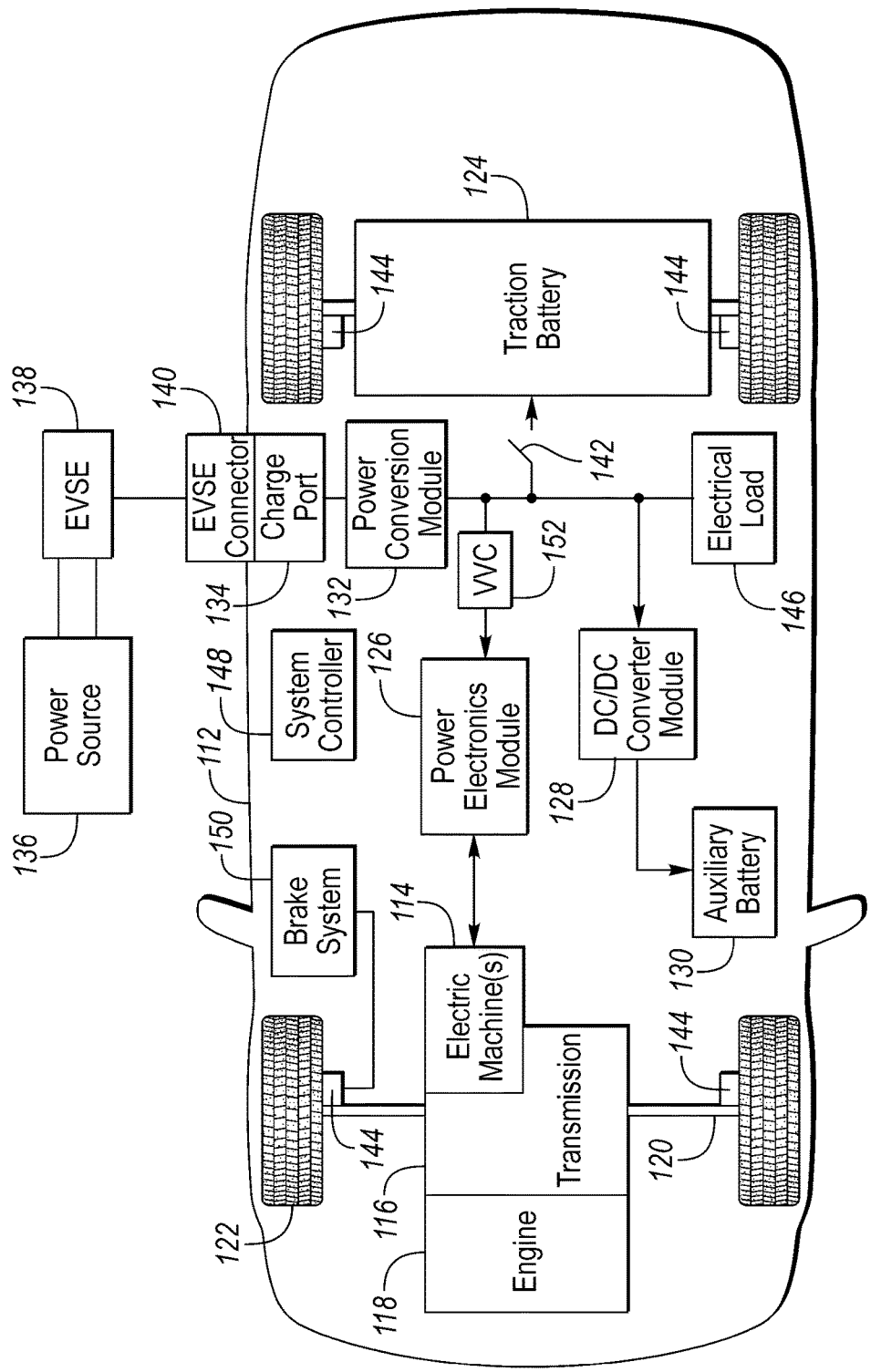
FIG. 1 is a diagram of a hybrid vehicle illustrating typical drivetrain and energy storage components with a variable voltage converter and power inverter therebetween.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
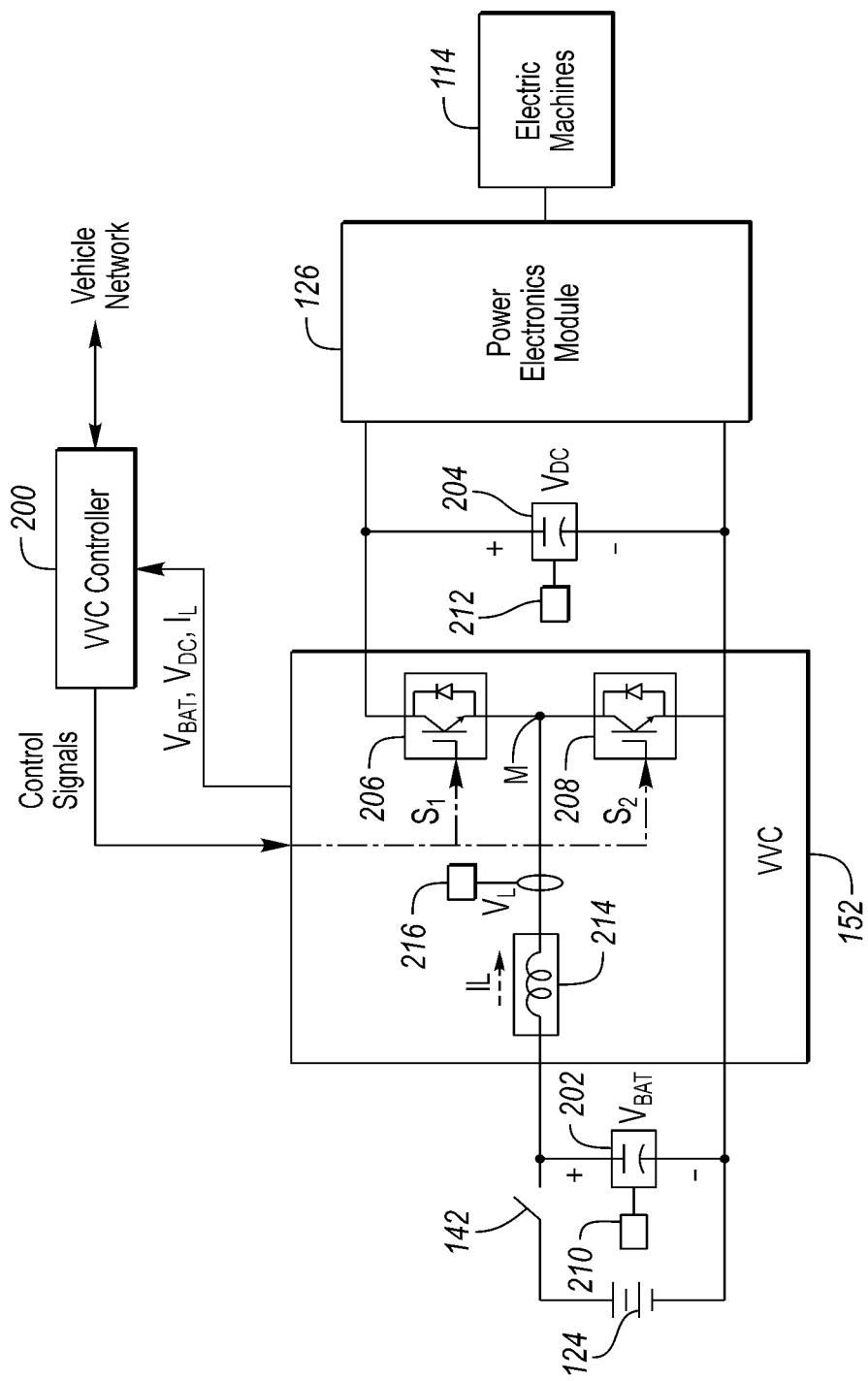
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V^*_{dc}$. The VVC controller 200 may determine, based on the electrical parameters and the voltage reference, $V^*_{dc}$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \qquad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214, often referred to as a boost inductor, may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V^*_{dc}$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current. The magnitude of the ripple current is also related to the duty cycle. The highest magnitude ripple current occurs when the duty cycle equals 50%.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g., 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
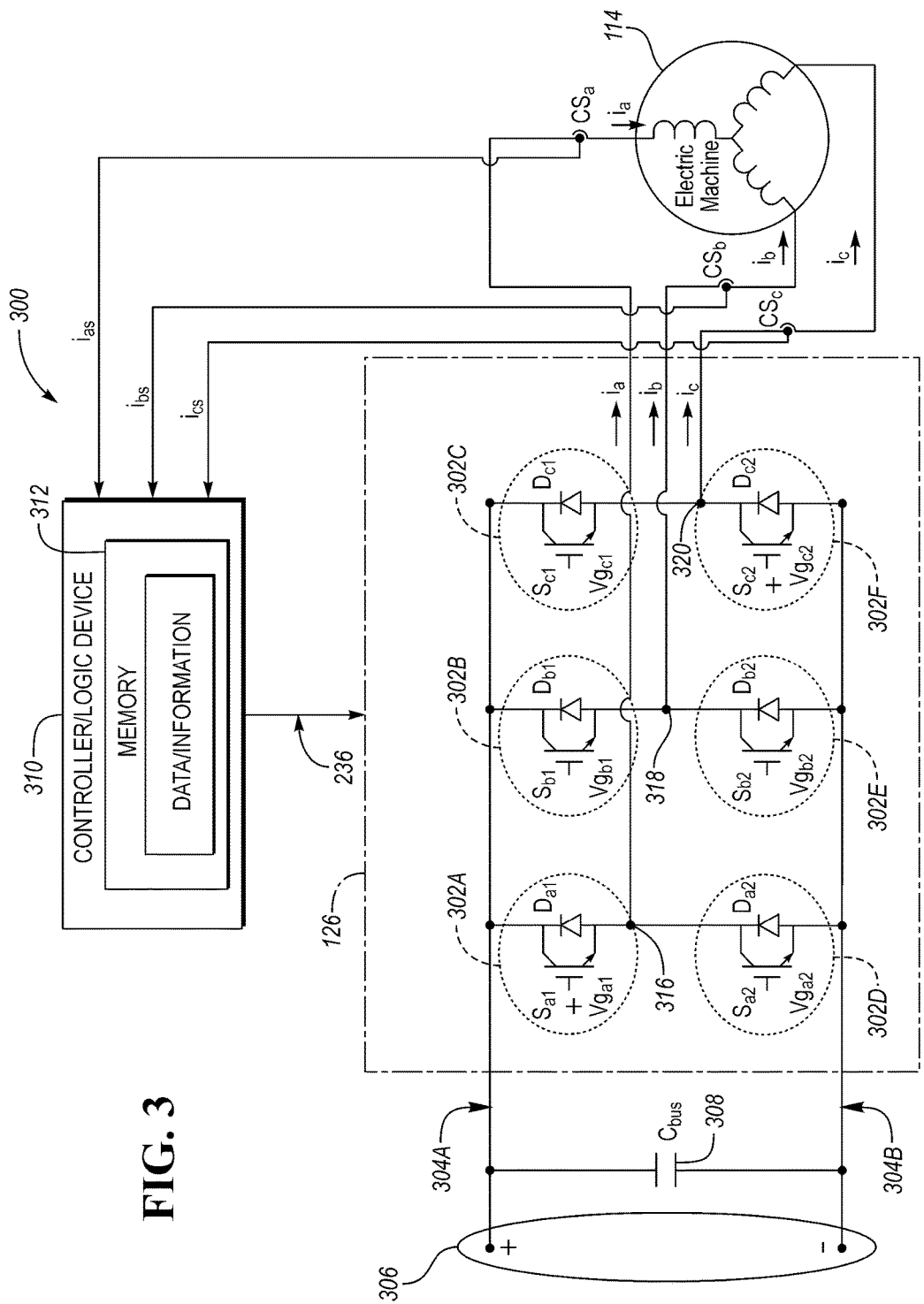
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the current mirror, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. The top switches are typically referred to as high-side switches (i.e., 302A, 302B, 302C) and the lower switches are typically referred to as low-side switches (i.e., 302D, 302E, 302F). Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 3: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4:
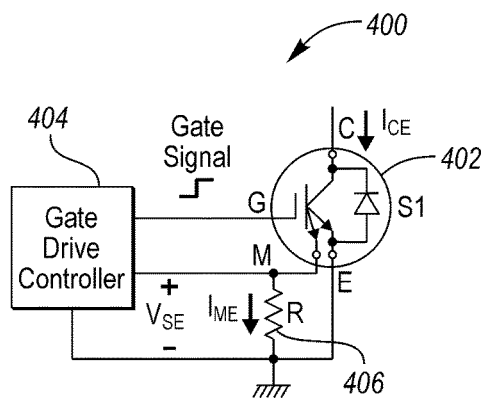
FIG. 4 is a schematic diagram of a gate driver for a power switch with a current mirror and fixed resistor feedback circuit.
Figure 5:
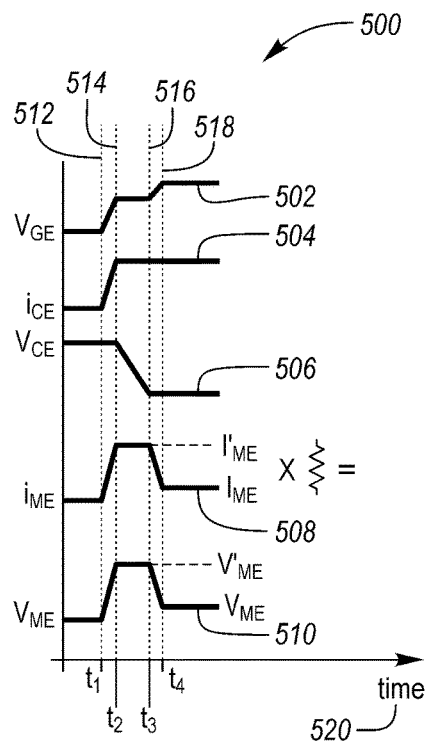
FIG. 5 is a graphical illustration of characteristics power switch with a current mirror of FIG. 4 with respect to time.

FIG. 4 is a schematic diagram of a gate driver for a power switch with a current mirror and fixed resistor feedback circuit 400. FIG. 4 is an IGBT gate drive circuit with feedback 400 that has current sensing and open circuit (OC)/short circuit (SC) protection via monitoring a current mirror of the IGBT. The power device 402 is a power switch with a current mirror output (e.g., a load IGBT with a mirror IGBT monolithically integrated such that the gates of both the load and mirror switch are connected) driven by a gate controller 404. The load current flows from the collector to the main emitter, while the current mirror flows from the collector to the mirror emitter. The current flowing out of the mirror emitter flows through a sense resistor 406 such that a voltage across the resistor 406 is equal to the current flowing through the resistor 406 multiplied by a resistance of the resistor 406. When the main IGBT (i.e., load IGBT) current $I_{CE}$ flows through IGBT Collector (C) and Emitter (E) terminals, a small fraction of current, (i.e., current mirror) $I_{ME}$ will flow out of the mirror IGBT, and the voltage across the resistor R 406 is fed back to gate drive IC for over current (OC) or/and short circuit (SC) protection. The relationship (e.g., coefficient) of $I_{ME}/I_{CE}$ is relatively stable when the IGBT is in an ON state, however, this coefficient may change significantly during IGBT turn-on as illustrated in FIG. 5, where the current mirror value $I'_{ME}$ during turn-on process could be multiple times higher than the value $I_{ME}$ in IGBT fully on state (The multiplier may be greater than 4, 5, or 10 times). Due to a current mirror spike during an IGBT turn-on as illustrated in FIG. 5, if a fixed resistor R 406 is used for current mirror sensing, the value of feedback voltage across the sensing resistor R 406 during turn-on process, $I'_{ME}$ could be multiple times higher than the value of $I_{ME}$ when the IGBT is in a fully on state as $V_{ME}=I_{ME} \cdot R$ and therefore limit the values of resistor R 406 that may be used.

If a fixed resistor R 406 is used for IGBT current mirror measurement, during IGBT turn-on, the gate drive circuit 404 will receive a voltage, based on the IGBT current mirror, that is significantly larger than a voltage based on a value of IGBT current while in fully on state. To avoid false-triggering of an IGBT OC/SC protection a protection threshold value for $V_{ME}$ is set higher than the $V'_{ME}$. This is indicative of a OC/SC protection threshold during turn-on that is higher than an IGBT when the device is on and the channel is saturated, (e.g., >5, 10, or 20 times). Based on this, a fault window is typically selected to be larger than the turn-on time (e.g. a turn-on time of 1 µs may have a fault window of 5 us). Filtering may be used to alleviate the problem caused by the current mirror spike in the feedback signal. However, with the use of a low-pass filter, there is a tradeoff between current spike suppression and the protection response. With the dynamic characteristics of the IGBT current mirror during turn-on, the OC/SC protection threshold and fault determination window time may have to be increased. The increase may lead to an increase current protection level and thus lower the response time in both the dynamic process (i.e., at IGBT turn-on) and the steady-state process (i.e., IGBT fully on steady-state)

FIG. 5 is a graphical illustration of characteristics of the power switch with a current mirror of FIG. 4 500 with respect to time 520. A gate to emitter voltage 502, a collector to main emitter current 504, a voltage across the collector and main emitter 506, a current mirror emitter current 508 and a mirror voltage 510, such as the voltage across a resistor (e.g., resistor R 406) coupled between the main emitter and current mirror emitter, are shown with respect to time 520. At a first point in time 512 a gate voltage 502 increases to turn on a gate controlled switch (e.g., an IGBT). As a channel is enhanced in the power switch, current begins to flow between the collector and main emitter 504 and mirror emitter 508 (also referred to as current mirror emitter 508). At a second point in time 514 when the gate voltage 502 equals the Miller plateau gate voltage, as extra charge is applied to the gate, the gate voltage 502 remains generally constant. During this time, the voltage across the collector and main emitter 506 begins to drop as the device approaches saturation. At a third point in time 516, the device enters saturation and VCE 506 levels off while the current mirror drops to an operational level at point in time 518.

Figure 6:
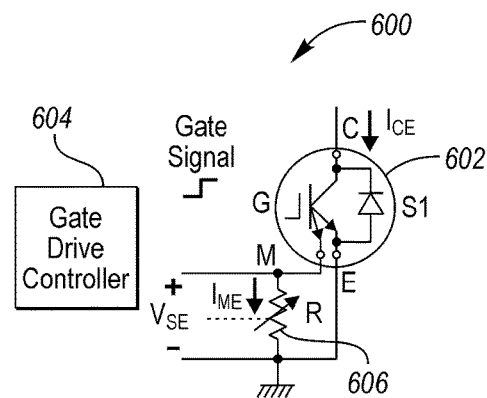
FIG. 6 is a schematic diagram of a gate driver for a power switch with a current mirror and variable resistor feedback circuit.
Figure 7:
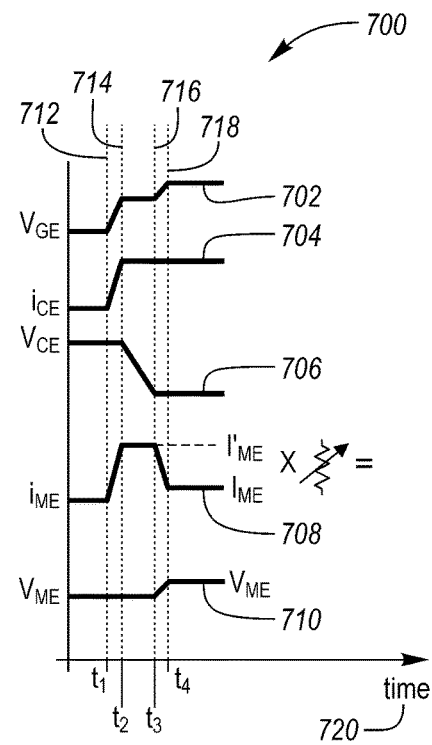
FIG. 7 is a graphical illustration of characteristics of the power switch with a current mirror of FIG. 6 with respect to time.

FIG. 6 is a schematic diagram of a gate driver for a power switch with a current mirror and variable resistor feedback circuit 600. In this illustration, the power switch is an IGBT having a gate drive circuit with feedback 600 that has current sensing and open circuit (OC)/short circuit (SC) protection via monitoring a current mirror of the IGBT. The power device 602 is a load IGBT with a mirror IGBT monolithically integrated such that the gates of both the load and mirror switch are connected and driven by a gate controller 604. The load current flows from the collector to the main emitter, while the current mirror flows from the collector to the mirror emitter. The current flowing out of the mirror emitter flows through a sense resistor 606 such that a voltage across the resistor 606 is equal to the current flowing through the resistor 606 multiplied by a resistance of the resistor 606. Here, resistor 606 is a variable resistor and the gate drive controller 604 is coupled with the variable resistor 606 such that the controller can change a resistance of the variable resistor 606. When the main IGBT (i.e., load IGBT) current $I_{CE}$ flows through IGBT Collector (C) and Emitter (E) terminals, a small fraction of current, (i.e., mirror current) $I_{ME}$ will flow out of the mirror IGBT, and the voltage across the variable resistor R 606 is fed back to gate drive IC for over current (OC) or/and short circuit (SC) protection. The relationship (e.g., coefficient) of $I_{ME}/I_{CE}$ is relatively stable when the IGBT is in an ON state (static or non-transient operation). However, this coefficient may change significantly during IGBT turn-on (dynamic or transient operation) as illustrated in FIG. 7, where the current mirror value $I'_{ME}$ during turn-on process could be multiple times higher than the value $I_{ME}$ in IGBT fully on state (e.g., the multiplier may be greater than 4, 5, or 10 times). The variable resistor 606 may be controlled to compensate for the current mirror spike during the IGBT turn-on as illustrated in FIG. 7. For example, The variable resistor R 606 may be at a low value initially during turn on until the gate voltage exceeds the Miller plateau gate voltage, and at that time, the variable resistance may be increased such that a voltage across the variable resistor 606 remains generally small with the resistance multiplier R 606 being small, and after exceeding the Miller plateau, the resistance is increased such that a change in current $I_{ME}$ results in a larger change in voltage across resistor 606.

For example, the controller sets a resistance of R 606 to a very low value during turn-on, and the controller then increases the resistance of R 606 back to a nominal value after the IGBT saturates (i.e., is fully turned on). The turn-on resistance may be 10, 50, 100, or 1,000 times less than the value during operation (nominal operation). The corresponding voltage and current waveforms are illustrated in FIG. 7. As the turn-on process is strongly tied to the gate voltage, the resistance of R 606 may be gate voltage dependent.

FIG. 7 is a graphical illustration of characteristics of the power and mirror switch 700 of FIG. 6 with respect to time 720. A gate to emitter voltage 702, a collector to main emitter current 704, a voltage across the collector and main emitter 706, a current mirror emitter current 708 and a mirror voltage 710, such as the voltage across a resistor (e.g., resistor R 606) coupled between the main emitter and mirror emitter, are shown with respect to time 720. When the power device receives a signal to turn on, the controller may set the resistance of resistor 606 to a very low level. Then at a fire point in time 712 a gate voltage 702 increases to turn on a gate controlled switch (e.g., an IGBT). As a channel is enhanced in the power switch, current begins to flow between the collector and main emitter 704 and mirror emitter 708. At a second point in time 714 when the gate voltage 704 equals the Miller plateau gate voltage, as extra charge is applied to the gate, the gate voltage 704 remains generally constant. During this time, the voltage across the collector and main emitter 706 begins to drop as the device approaches saturation. The controller may then change the resistance of resistor 606 at a third point in time 716, such that as the device enters saturation a feedback voltage $V_{ME}$ may be increased based on the increased resistance of R 606 until $V_{CE}$ 706 levels off and the current mirror drops to an operational level at point in time 718.

FIG. 8 is a schematic diagram of a gate driver for a power switch with a current mirror and a selectable resistance feedback circuit 800. In this illustration, the power switch is an IGBT having a gate drive circuit with feedback 800 that has current sensing and open circuit (OC)/short circuit (SC) protection via monitoring a current mirror of the IGBT. The power device 802 is a load IGBT with a mirror IGBT monolithically integrated such that the gates of both the load and mirror switch are connected and driven by a gate controller 804. The load current flows from the collector to the main emitter, while the current mirror flows from the collector to the mirror emitter. The current flowing out of the mirror emitter flows through a sense resistor R1 806 and turn-on resistor R2 808 when switch 810 is turned on such that a voltage across $V_{ME}$ is equal to the current flowing through the parallel combination of resistor R1 806 and resistor R2 808 multiplied by a resistance of the parallel combination of resistor R1 806 and resistor R2 808. The resistance of resistor 808 may be lower than the resistance of resistor R1 806.

So, as shown in FIG. 9, before t1 906, the gate voltage of $V_{GE}$ is at low level (e.g. substantially zero volts) and the IGBT S1 802 is in an off state, the control unit for switch S2 810 detects gate voltage $V_{GE}$ and outputs a signal $V_{GE2}$ to turn on S2 810, at this point in time, a current mirror sensing voltage $V_{ME}$ will be substantially zero. Then from time t1 906 to t2 908, the IGBT 802 begins to turn-on, $V_{GE2}$ remains high to maintain S2 810 on. With S2 810 on, the equivalent sensing resistance is equal to R1 806/R2 808, which is less than R2 808. R1 806 is selected to minimize the voltage spikes of $V_{ME}$. For example, a value of R1 may be close to zero. After t2 908, the control unit for switch S2 detect gate voltage $V_{GE}$ higher than a pre-set threshold value $V_{GE-pre}$, (e.g., a Miller plateau gate voltage) indicating that IGBT 802 in fully on state (e.g., saturated). After t2 908, the current mirror reverts back to a standard operating value and the corresponding to IGBT current $I_{CE}$, and the controller outputs the control gate voltage $V_{GE2}$ at a low level (e.g. zero volt) to turn off S2 810.

FIG. 9 is a graphical illustration of control and characteristics of the power and mirror switch of FIG. 6 900 with respect to time 910. A gate to emitter voltage 902, a variable resistance control signal 904 are shown with respect to time 910. When the power switch is first turned-on at time t1 906, the power switch control signal is high enabling a second resistor to be coupled in parallel to reduce the sense resistance (e.g., power switch 810 is turned on and R2 808 is coupled in parallel with R1 806, lowering the effective resistance). As the gate voltage exceeds the Miller plateau gate voltage at point t2 908, the controller disabled the parallel resistor R2 808 such that the effective resistance is then increased to the resistance of R1 806.

FIG. 10 is a schematic diagram of a gate driver for a power switch with a current mirror and a selectable resistance feedback circuit 1000. In this illustration, the power switch is an IGBT having a gate drive circuit with feedback 1010 that has current sensing and open circuit (OC)/short circuit (SC) protection via monitoring a current mirror of the IGBT. The power device 1002 is a load IGBT with a mirror IGBT monolithically integrated such that the gates of both the load and mirror switch are connected and driven by a gate controller 1004. The load current flows from the collector to the main emitter, while the current mirror flows from the collector to the mirror emitter. During turn-on the controller outputs a signal $R_C$ to select a turn on resistance value. The signal $R_C$ may be a single signal or multiple signals forming a bus. For example, $R_C$ may be a multiplexed signal such as a Serial Peripheral Interface (SPI) bus, Universal Asynchronous Receiver/Transmitter (UART) bus, $I^2C$ bus, 1-wire bus, or other format, or $R_C$ may be a parallel bus each coupled with a switch or encoded to select a switch of a solid-state variable resistor 1010. Further, along with selection of the resistance, signal $R_C$ may include an enable signal to engage/disengage the selected switches. The turn-on resistance value is equal to the equivalent resistance of the selected resistance of the solid-state variable resistor 1010 in series with a turn-on resistor R2 1008 both of which are in parallel with operational resistor R1 1006. When the controller outputs $R_C$ to open all switches, the equivalent resistance is simply the resistance of R1 1006 and current flowing out of the mirror emitter flows through a sense resistor R1 1006 such that a voltage across $V_{ME}$ is equal to the current flowing through the resistor R1 1006 multiplied by a resistance of the resistor R1 1006. However, during turn-on, the controller may enable a resistance of the solid-state variable resistor 1010. For example, if the controller outputs a signal to close the first switch in which the resistance of the solid-state variable resistor 1010 is substantially zero, the voltage across $V_{ME}$ would be equal to the current flowing through the parallel combination of resistor R1 1006 and resistor R2 1008 multiplied by a resistance of the parallel combination of resistor R1 1006 and resistor R2 1008. In this embodiment, the controller may change a selection of resistance based on criteria including an ambient temperature, a temperature of the power device 1002, a power demand, or other operational aspect.

In a conventional current sensing system with OC/SC protection, the feedback resistance value is selected to be a value much higher than needed for normal operational IGBT conduction current level (e.g. >5 times) and the fault window time must be larger than the IGBT turn-on time (e.g. 1 μs). This results in an increased current protection level and increased protection response time. The performance of OC/SC protection method is limited/affected by IGBT dynamic process (IGBT turn-on). Here, a variable resistor is used to reduce the current mirror spike in the feedback signal during IGBT turn-on, lower OC/SC protection threshold value (e.g. 2 times that of a normal current level) and reduce a response window time (e.g. 0.5 μs) without limiting the IGBT turn-on.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle powertrain comprising:
 a power inverter including
  a load switch with main and current mirror emitters, and
  a variable resistor coupled between the main and current mirror emitters; and
 a controller configured to
  adjust a gate voltage based on a voltage across the variable resistor, and
  responsive to the gate voltage exceeding a Miller plateau gate voltage, increase a resistance of the variable resistor such that a feedback voltage increases as the load switch saturates.

2. The vehicle powertrain of claim 1, wherein the variable resistor includes a first resistor coupled in parallel with a second resistor that is selectable via a solid-state switch, wherein a resistance of the first resistor is greater than the second resistor.

3. The vehicle powertrain of claim 1, wherein the variable resistor is a solid-state variable resistor coupled in parallel with a sense resistor.

4. The vehicle powertrain of claim 3, wherein the controller is further configured to select a resistance of the solid-state variable resistor based on an ambient temperature.

5. The vehicle powertrain of claim 3, wherein the controller is further configured to select a resistance of the solid-state variable resistor based on a temperature of the load switch.

6. The vehicle powertrain of claim 1, wherein the load switch is an Insulated Gate :Bipolar Junction Transistors (IGBTs).

7. A vehicle powertrain comprising:
 a load switch monolithically integrated with a mirror switch;
 a variable resistor coupled between a mirror switch emitter and a reference point; and
 a controller configured to
  adjust a gate voltage based on a voltage across the variable resistor, and
  responsive to the gate voltage exceeding a Miller plateau gate voltage, increase a resistance of the variable resistor such that a feedback voltage increases as the load switch saturates.

8. The vehicle powertrain of claim 7, Wherein the reference point is a main emitter and the load switch and the mirror switch are insulated Gate Bipolar Junction Transistors (IGBTs).

9. The vehicle powertrain of claim 7, wherein the variable resistor includes a first resistor coupled in parallel with a second resistor that is selectable via a solid-state switch, wherein a resistance of the first resistor is greater than the second resistor.

10. The vehicle powertrain of claim 7, wherein the load switch is configured to flow current into an inductor of a variable voltage converter.

11. The vehicle powertrain of claim 7, wherein the load switch is in a power inverter and configured to flow current into a phase winding of an electric machine.

12. The vehicle powertrain of claim 7, wherein the variable resistor is a solid-state variable resistor coupled in parallel with a sense resistor.

13. The vehicle powertrain of claim 12, wherein the controller is further configured to select a resistance of the solid-state variable resistor based on an ambient temperature.

14. The vehicle powertrain of claim 12 wherein the controller is further configured to select a resistance of the solid-state variable resistor based on a temperature of the load switch.

15. A method of controlling a power switch in a vehicle powertrain comprising:
 setting a resistance of a variable resistor, coupled between a current mirror emitter and reference point, to a first value while a gate voltage of the power switch is below a turn-on threshold;
 applying a charge to the gate to increase the gate voltage; and
 responsive to the gate voltage exceeding a Miller plateau gate voltage, increasing the resistance of the variable resistor.

16. The method of claim 15, wherein the variable resistor includes a first resistor coupled in parallel with a second resistor that is selectable via a solid-state switch, and changing the resistance of the variable resistor is disconnecting the second resistor.

17. The method of claim 15, wherein the resistance is set based on a temperature of the power switch.

18. The method of claim 15, wherein the resistance is set based on a power demand of the vehicle powertrain.

* * * * *